United States Patent [19]

Kreinberg

[11] Patent Number: 4,790,760
[45] Date of Patent: Dec. 13, 1988

[54] POWER DISTRIBUTION ADAPTER

[75] Inventor: Earl R. Kreinberg, Phoenix, Ariz.

[73] Assignee: AMP Incorporated, Harrisburg, Pa.

[21] Appl. No.: 65,239

[22] Filed: Jun. 22, 1987

[51] Int. Cl.⁴ ............................................. H01R 9/09
[52] U.S. Cl. ..................................... 439/55; 439/59; 439/77
[58] Field of Search ...................... 439/55, 59, 61, 63, 439/65, 67, 70, 74–79, 92, 101

[56] References Cited

U.S. PATENT DOCUMENTS

| 3,215,975 | 11/1965 | Kinkaid | 339/256 |
| 3,409,862 | 11/1968 | Lynch et al. | 339/196 |
| 3,474,394 | 10/1969 | Hammell et al. | 339/176 |
| 3,496,523 | 2/1970 | Gluntz | 339/192 |
| 3,656,093 | 4/1972 | Kinkaid | 339/17 L |
| 3,993,936 | 11/1976 | Meade et al. | 439/59 |
| 4,402,564 | 9/1983 | Frantz | 339/17 F |

FOREIGN PATENT DOCUMENTS 60-110632  5/1985  Japan .

OTHER PUBLICATIONS

Addendum Figures 1–5, photographs of prior art product of IBM Corporation.
AMP Incorporated Buyers Guide, 1976, pp. 791–792, "Dual Disconnect".
"Commercial Interconnection System (Modular Board-to-Board and Board-to-Wire System" AMP Incorporated catalog 73-108, revised 4-86.

Primary Examiner—Gil Weidenfeld
Assistant Examiner—Paula A. Austin
Attorney, Agent, or Firm—Eric J. Groen; Ness: Anton P.

[57] ABSTRACT

A power distribution system includes flexible cable interconnected to receptacle connectors which can be interconnected to mother boards or daughter boards. To assist in the distribution of power, an adapter member is disclosed which can be interconnected to a post header or directly to a pin field. The adapter member includes two rows or pins which are commoned to each other and to a receptacle portion which is interconnectable to the posts in the post header or to the pins in the pin field.

5 Claims, 8 Drawing Sheets

POWER DISTRIBUTION ADAPTER

BACKGROUND OF THE INVENTION

1. Field of the Invention

The instant invention relates to an apparatus and method for electrically distributing power to a plurality of electrical devices.

2. Description of the Prior Art

The present state of technology with respect to the distribution of power from mother boards to daughter cards within computers or other electronic packaging systems is either handled by bringing power to the mother board and distributing the power to the daughter cards via circuit traces on the mother boards, or by bringing power directly from a power source to the connectors which house the daughter cards.

Daughter cards are aligned on the mother board in lateral arrays upstanding from the mother board in vertical planes. The daughter cards include a plurality of integrated circuit hardware mounted thereon including both logic and memory chips. The daughter cards include several traces which terminate to one side edge for interconnection to an edge card connector. The traces include both traces for data and power, as the circuit components must be powered.

The mother board is typically configured as a large printed circuit board consisting of a nonconductive material such as a glass epoxy. The mother board also includes a plurality of edge card connectors to which the daughter cards are connected. The edge card connectors include pins projecting through holes in the mother board to form a dense pin field on the back side of the mother board. As the daughter cards include both signal and power traces on the board, the pins which form the pin field are interconnected to both power and data.

The increasing need to conserve more printed circuit board space and to more densely populate the printed circuit daughter cards with more components has led to the requirement for more power to the daughter cards to power the components.

SUMMARY OF THE INVENTION

It is an object of the instant invention to reduce the labor intensiveness of the prior art methods of distributing power to pluralities of edge card connectors on mother boards.

It is a further object to increase the amount of current capable of being carried through the current carrying media, and delivered to the designated pins of the pin field on the edge card connector alleviating the necessity of increasing the number of dedicated pins on the edge card connector to power which conserves pins for the distribution of data.

It is a further object of the invention to provide a means for flat cable to be used in the distribution of power to a plurality of daughter cards.

In an electronic system including a mother board having at least two edge card connectors mounted thereon with at least two edge card connectors housing daughter cards therein where the edge card connectors include pins projecting through the mother board to form a pin field on an underside of the mother board with the the edge card connector pins being preselected and dedicated for the transfer of both power and data with the edge card connectors including a like plurality of pins dedicated to a positive and a negative polarity of d.c. power; a method of distributing the power from a power source to the daughter cards includes or is characterized by the steps of providing a a first insulated cable having a flat conductor in which a current is provided to such first flat conductor from a power source; the current is thereafter divided from the flat conductor into separate current paths, the divisions being equal in number to the plurality of pins on a first edge card connector dedicated to the positive polarity; the individual current paths are thereafter interconnected to respective pins of the positive polarity on the first edge card connector. A second insulated cable is included which has a flat conductor therein, the first and second flat conductors being commoned together. The current from the second flat conductor is divided into separate current paths equal in number to the plurality of pins on the second edge card connector which are designated to the positive polarity. Finally, a return path from the negative polarity of pins on the first and second edge card connectors are provided to the power source.

An adapter which is capable of being used with the pin field in the above-described method which is used for distributing power to a number of devices along the length of a power cable includes at least one electrical contact means which has two first electrical terminal means positioned in an array, means to common the first electrical terminal means together and at least one second electrical terminal means commoned to the first electrical terminal means. An insulative housing means is provided which at least partially surrounds the electrical contact means such that when current is applied to one of the first electrical terminal means, a portion of the current is applied to a device which is connected to the second electrical terminal means and the remainder of the current is transferred to other devices through the remainder of the first electrical terminal means and downstream along the length of the power cable.

BRIEF DESCRIPTION OF THE DRAWINGS

FIG. 6 is a cross-sectional view through lines 6—6 of FIG. 5 showing the terminal installed.

DETAILED DESCRIPTION OF THE PREFERRED EMBODIMENT

Figure 1:
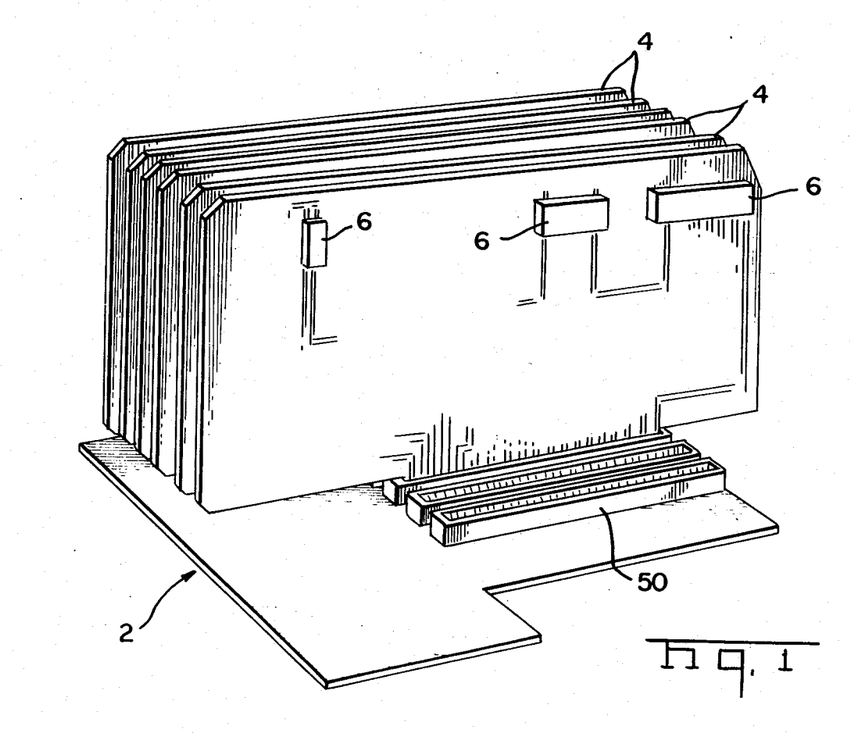
FIG. 1 is an isometric view of a mother board or backplane depicting the environment in which the subject invention will operate.

FIG. 1 shows a typical environment in which the subject application would be used, that is bringing power into electronic devices such as the mother board shown generally as 2. The mother board 2 is generally profiled as a printed circuit board having a plurality of daughter cards such as 4 being interconnected to the mother board 2 via the edge card connectors shown generally as 50. As shown in FIG. 1, a typical mother board would also consist of a plurality of dual inline packages (DIPs) such as 6 interconnected to the daughter cards either via DIP headers, or by being directly soldered to the cards.

Figure 2:
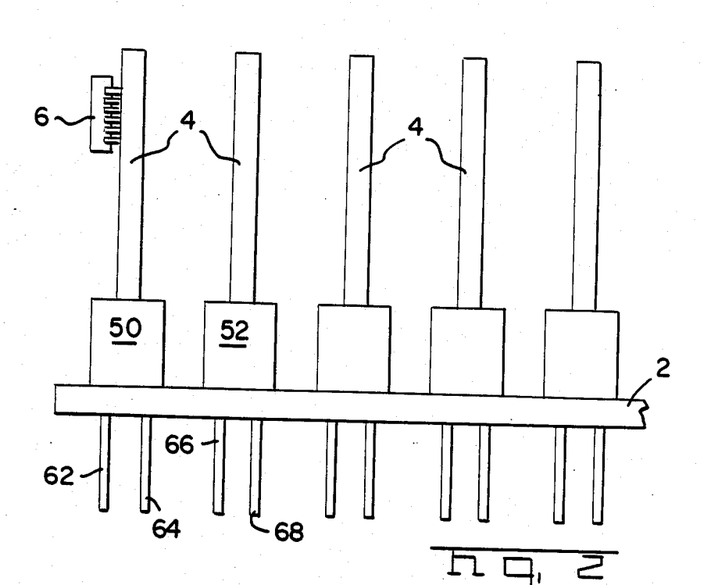
FIG. 2 is a side view of the mother board of FIG. 1 showing the pin field with greater clarity.
Figure 3:
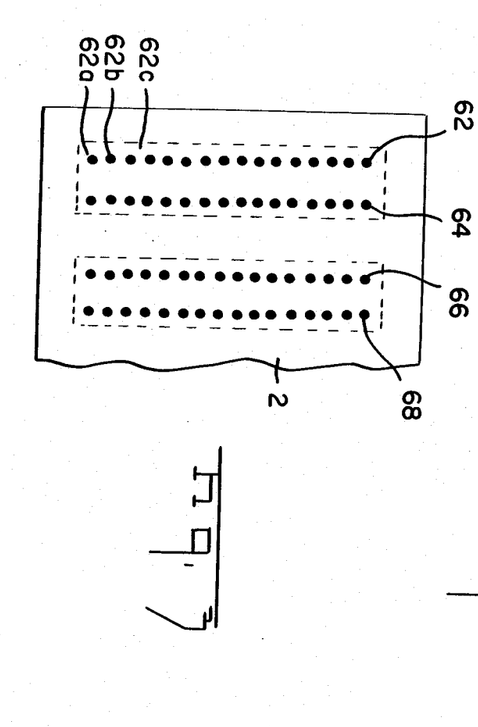
FIG. 3 is a bottom view of the pin field of FIG. 2.

FIG. 2 shows a side view of a mother board 2 including such edge card connectors as 50 and 52 which include rows of pins such as 62–68 which form a pin field on the back side of a mother board. FIG. 3 shows the pin field from an underside where the rows 62–68 can be seen more clearly. The rows 62–68 are formed by individual pins, for example row 62 is formed by pins 62a–62c. It is to be understood that the actual rows of pins may include as many as 60 pins per row, but only a fiew pins will be discussed herein for simplicity.

Figure 4A:
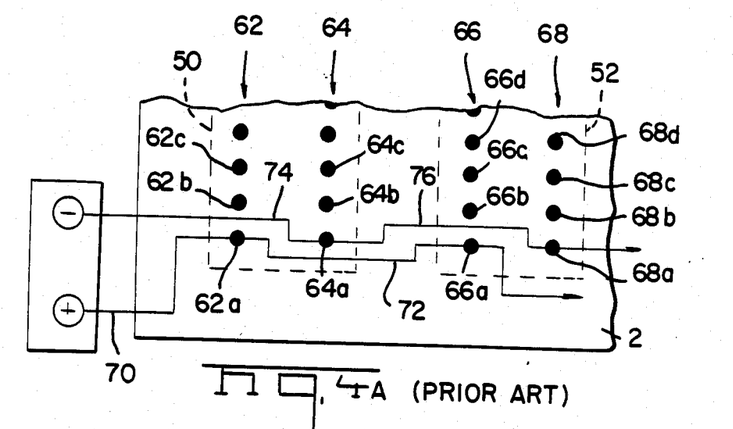
FIGS. 4A and 4B are exploded views of sections of the pin field of FIG. 3 showing prior art methods of power distribution between daughter cards.
Figure 4B:
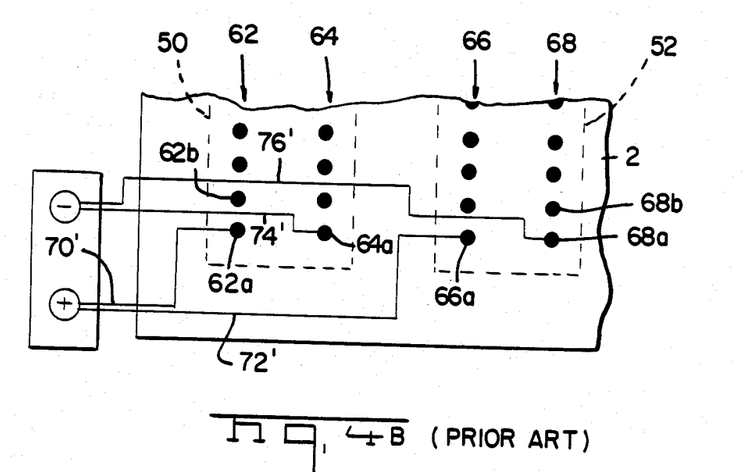

Referring now to FIGS. 4A and 4B, the present method of bringing power to the daughter cards will be be described. FIG. 4A shows a first example where the power is brought to the pins from the power source and respective pins in the next connector are then connected via the same electrical media, be it traces on the mother board or discrete wires from the power source; although if discrete wires are used, wire wrapping is typically used.

Referring first to FIG. 4A, the edge card connector 50 includes rows 62 and 64, while edge card connector 52 includes rows 66 and 68. It is typical for the power to be brought into the edge card connectors via the pin field, via dedicated pins, for example several of the pins in the row 62 would be dedicated to one polarity of d.c. power while the opposite row 64 would include a like plurality of opposite pins dedicated to the other polarity of the d.c. power. For example, with a connector having for example 60 pins in each row, typically 10 pins would be used in each row for the distribution of d.c. power, one row of pins having a positive polarity and the opposing row of pins having a negative polarity. The positive polarity (+) would then be interconnected to a first pin such as 62a, which would then be continued on to interconnect the same respective pin in the adjacent connector, and the sequence would be carried out through all edge card connectors. The minus (−) polarity would then be similarly interconnected to pin 64a and jumpered to the next respective pin in the adjacent connector. This method of interconnection has an inherent drawback in that the current in the segments 70 and 74 is larger than in the segments 72 and 76 as the current is summed at the nodes, which in this case are the pins. If the portions 70 and 74 are circuit board traces, there will be a physical limitation to the size of the traces due to the area on the mother board 2, and therefore the current carrying capability of the traces is limited. If the portions 70 and 74 are discrete wire which is wire wrapped, the job becomes more difficult as the wire stiffness increases as the wire gauge increases.

FIG. 4B shows an alternate version of wiring the card edge connectors which includes running dedicated portions such as 70'–76' to each pin from the power source. As can be appreciated, whether the portions are discrete wire or ciruit traces, the number of portions is increased over the configuration shown in FIG. 4A. For example, if five card edge connectors are used and each connector has ten pins in each row dedicated to power, there would be 100 traces or discrete wires extending from the power source to the pin field. If printed circuit board traces are used, 100 traces would use an inordinate amount of board space, and if 100 discrete wires were used, the labor intensity would be extremely high.

The instant invention removes the shortcomings of the prior methods of power distribution by incorporating means for flat cable as the power distribution media. The flat cable is shown more illustratively in my prior patent application Ser. No. 050,793, filed May 14, 1987, the subject of which is incorporated herein. By using flat cable as the power distribution media, the flat cable can be adjusted in cross section to accommodate the current requirements without the concerns of wire wrapping limitations. Also, by using the flat cable as the power distribution media, the quantity of pins can be conserved. If discrete wires or printed circuit board traces are used, when the current carrying capability of the media is met, more pins from the pin field must be dedicated for the distribution of power. This requires that the edge card connector must be increased overall to retain the same number of positions for the distribution of data.

The power distribution would generally include flexible insulated cable forming flexible busses interconnected to the pin fields. As described in my earlier filed patent application Ser. No. 050,793 cited above, an insulation displacement interconnect would allow for the flat cable to be connected to crimp type contacts of electrical connectors. An adapter will now be disclosed herein which will facilitate the connection and disconnection of the flexible busses which are formed by the flat flexible cable portions.

Figure 5:
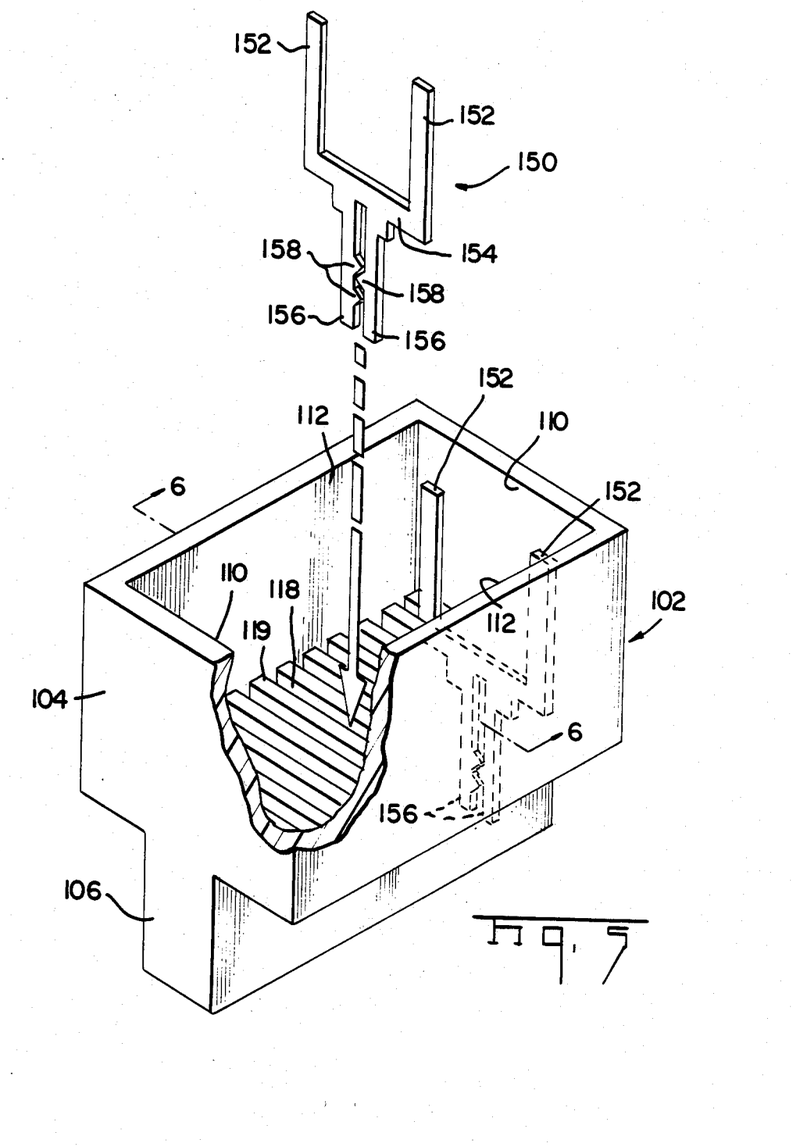
FIG. 5 is an isometric view of the housing of the instant invention showing a terminal exploded therefrom.

Referring first to FIG. 5, a housing 102 is shown as generally including an upper compartment 104 and a lower receptacle compartment 106. The housing 104 has an inner cavity formed by inner sidewalls 112 and inner end walls 110. The inner cavity has a floor 119 which has a plurality of channels 118 extending thereacross which form recesses for electrical terminals which will be described herein.

The terminal 150 of the adapter member generally includes a bar portion 154 having two post members 152 upstanding therefrom and a receptacle portion defined by two leg members 156 extending downwardly therefrom, each leg portion having at least one raised contact portion 158.

Referring now to FIG. 6, the terminal 150 is shown positioned within the housing 102, the terminals residing within the plurality of lower cavities 118 such that the bar portions 154 of the terminals 150 reside on a floor 114. The cavities 118 are spaced laterally to space the terminals into two rows of laterally spaced posts. The lower receptacle portion is defined by inner sidewalls 116 which receive the lower leg portions 156 and positions them adjacent to an opening 120 in the lower receptacle portion 106.

Figure 7:
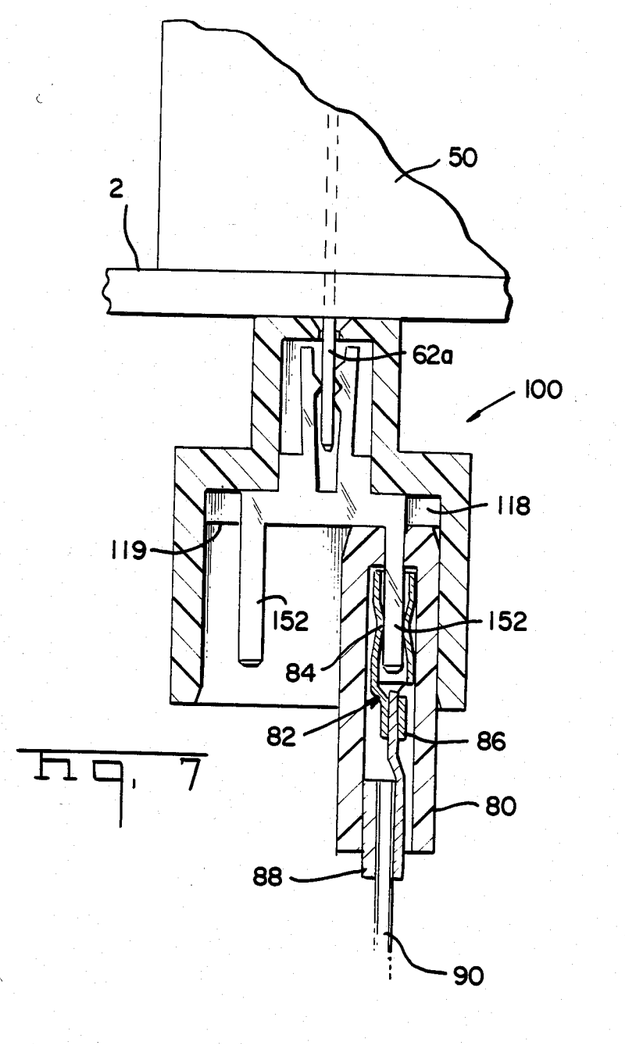
FIG. 7 is a cross-sectional view similar to that of FIG. 6 showing the adapter of the instant invention interconnected to the pin field on the mother board and a receptacle header interconnected to flat cable bringing power into the mother board.

FIG. 7 depicts a pin such as 62a projecting down through the mother board 2. The adapter member 100 is interconnected to the underside of the mother board and to the pins within the row 62 with the forked contacts straddling the pins within the row. An electrical connector 80 is interconnected to the flat cable 90, the connector 80 being of the type shown in U.S. Pat. Nos. 4,385,794 and 4,435,035. The interconnection member 88 is of the type described in my earlier filed patent application Ser. No. 050,793 which allows a crimp type contact, such as the type shown in U.S. Pat. No. 4,385,794, to be interconnected to the flat cable 90. The interconnection member would include finger portions which are on the same pitch as the centerline spacing of contacts within the connector. Furthermore, the interconnect member 88 would include finger portions equal in number to the pins which are dedicated to power in one edge card connector. The contact 82 includes a crimp end which is affixed to the end of the interconnect member 88, and a resilient contact portion 84 which electrically connects to the post 152.

Figure 8:
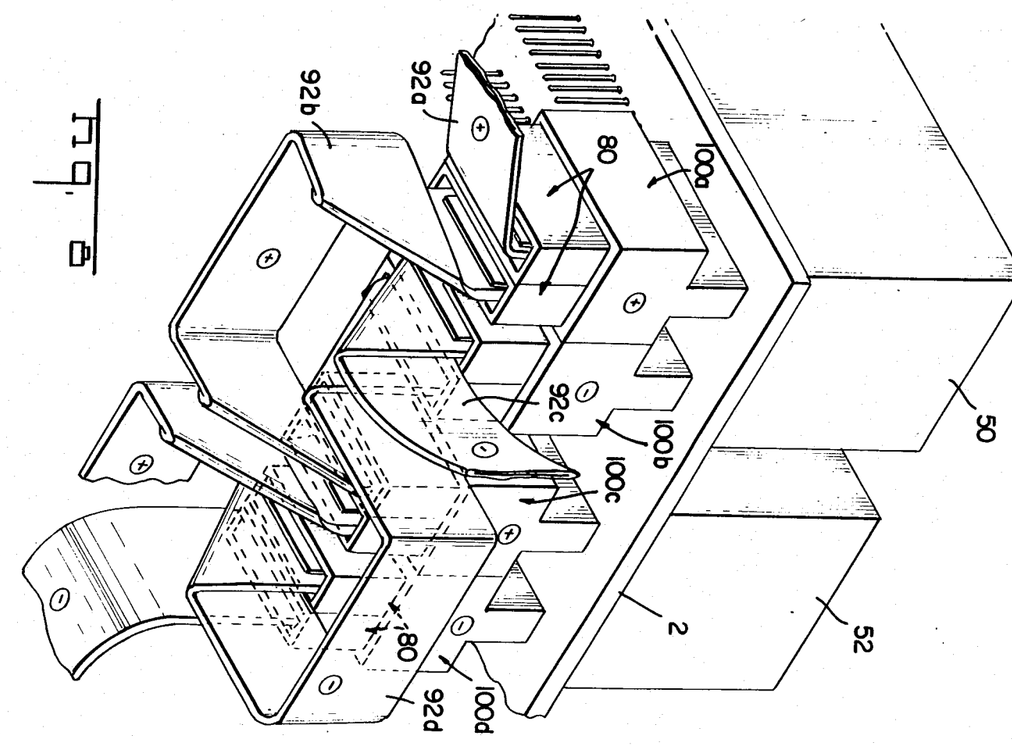
FIG. 8 is an isometric view showing several card edge connectors being interconnected with lengths of the flat power cable.
Figure 9:
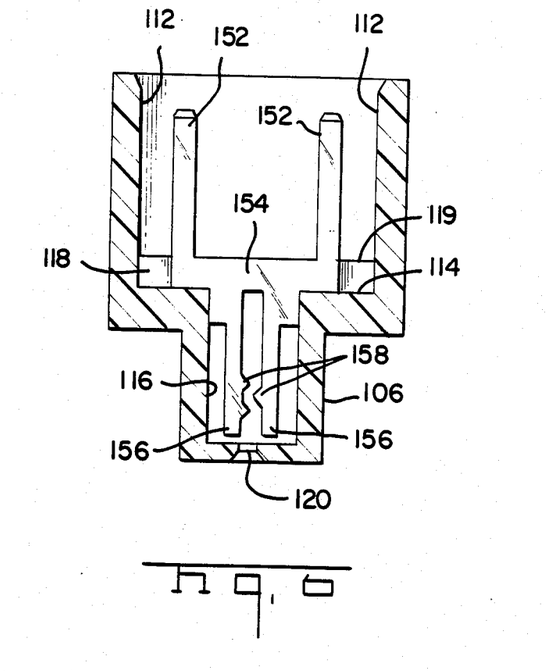
FIG. 9 shows the adapter being used to interconnect power directly to the daughter cards.

As shown in FIG. 8, several adapters 100a–100d can be attached to the pin field with several flexible buss sections interconnecting the successive edge card connectors. For example, if ten pins in each row of the edge card connector are devoted to power, two adapters 100 would be used for each edge card connector, one for each polarity, each having ten contacts within the housing 102. The interconnect portion 88 would include ten fingers and the connector would be a ten position connector with each contact being interconnected to a separate finger portion. This would allow a first bussing portion 92a to be connected from the power source to the first adapter member, and a second bussing portion 92b having the same polarity as bussing portion 92a, to be interconnected to adapter member 100c. Another bussing portion 92c would be interconnected to the opposite polarity and would be interconnected to the adapter member 100b, while a further bussing portion 92d further connects the adapter member 100d to the opposite polarity. It should be appreciated that the flexible bussing portions, comprising the flat cable, interconnect members, and connectors, could be mass produced for specific applications and the installation would be greatly simplified by the adapter members. The flexible busses can also be field installed without great difficulty.

A further application of the above mentioned adapter member 100 relates to distributing the power directly to the daughter cards as shown in FIG. 10. The adapter member 100 may be received within a post header, such as 250, which includes a plurality of posts 252 which are soldered or otherwise interconnected to a like plurality of traces 260 on the printed circuit barod 4 which distribute power to the components such as the DIP packages which require the power. Power will be brought into the adapter member 100 via a bussing member 190 again comprising flat flexible cable which is interconnected to a receptacle 180, via an interconnect section 188 similar to interconnect section 88 described above. The header 180 generally includes receptacle contact members having resilient contact portions for contacting the posts 252. Once again, bussing sections could be looped from daughter card to daughter card, or from one section of a daughter card to another section of the same daughter card. It should be appreciated that the adapter member 100 and the method of distributing power in conjunction with the adapter is a great improvement to the present methods of power distribution.

The above described method and apparatus for the distribution of power was made with reference to the specific drawings attached hereto, but should not be taken to limit the claims which follow.

What is claimed:

1. In an electronic system including a first substrate having at least two edge card connectors mounted thereon, each edge card connector housing a second substrate therein, the edge card connectors including pins projecting through the first substrate to form a pin field on an underside of the first substrate, the edge card connector pins being preselected and dedicated for a transfer of both power and data, the power pins having a like plurality of pins dedicated to a positive and a negative polarity for direct current power, a method of power distribution to the second substrates includes the steps of:
   providing a first insulated cable having a flat conductor therein;
   providing a current flow to the first flat conductor from a power source;
   dividing the current from the flat conductor into separate current paths equal in number to the plurality of pins on the first edge card connector dedicated to the positive polarity;
   interconnecting the current paths of the first cable to respective pins for the positive polarity on the first edge card connector;
   providing a second insulated cable having a flat conductor therein;
   commoning the first and second flat conductors together;
   dividing the current from the second flat conductor into separate current paths equal in number to the plurality of pins on the second edge card connector dedicated to the positive polarity; and
   providing a return path from the negative polarity pins on the first and second edge card connectors to the power source.

2. The method of claim 1 wherein the step of providing a return path for the negative polarity pins includes the steps of:
   providing a third insulated cable having a flat conductor therein;
   interconnecting the pins on the second edge card connector dedicated to the negative polarity to the third flat conductor;
   interconnecting the pins on the first edge card connector dedicated to the negative polarity to the third flat conductor;
   providing a fourth insulated cable having a flat conductor therein;
   commoning the third and fourth flat conductors together; and
   returning the current flow to the power source.

3. In an electronic system including a first substrate having at least two edge card connectors mounted thereon, each edge card connector housing a second substrate therein, the edge card connectors including pins projecting through the first substrate to form a pin field on an underside of the first substrate, the pins of each edge card connector being preselected to include power and data connections, the power pins including a like plurality each for positive and negative polarity of direct current power, a power distribution system for the electronic system comprises:
   first adapter means having contact portions for interconnection to pins of the first edge card connector designated for the positive polarity, and terminal means commoned to the contact portions and being arranged into arrays of input and output terminal means;

a first insulated cable means having means for interconnection to the positive polarity of direct current power, and having a flat conductor therein having contact portions interconnected to the flat conductor, the contact portions being mated to the input array of terminal means of the first adapter means;

a second insulated cable means having a flat conductor therein including means for mating to the output array of terminal means on the first adapter means and means for interconnection to the pins designated for the positive polarity on an adjacent second substrate; and means for providing a return path from the pins on the first and second edge card connectors designated for the negative polarity to a negative polarity of the direct current power source.

4. The power distribution system of claim 3 wherein the means for providing a return path comprises:

second adapter means having contact portions for interconnection to the edge card connector pins of the negative polarity of direct current power and terminal means commoned to the contact portions of the second adapter means and being arranged into arrays of input and output terminal means;

a third insulated cable means having a flat conductor therein having means for interconnection to the pins of the negative polarity of the adjacent second edge card connector, and means for interconnection to the array of input terminal means of the second adapter means;

a fourth insulated cable means having a flat conductor therein having contact portions interconnected to the flat conductor which are interconnected to the array of output terminal means of the second adapter, and means for interconnecting the flat conductor to the negative polarity of direct current power source.

5. The power distribution system of claim 4 wherein the first and second adapter means are identical, each comprising a plurality of contact means including two upstanding posts commoned to a receptacle portion.

* * * * *